United States Patent [19]

Kouan et al.

[11] Patent Number: 4,904,945

[45] Date of Patent: Feb. 27, 1990

[54] APPARATUS AND PROCESS FOR DETECTING DIRECT CURRENT MAGNETIC FLUX DEFLECTIONS IN AN ELECTRICAL TRANSFORMER EMPLOYING FOURIER ANALYSIS

[75] Inventors: Toyokazu Kouan; Katsumi Shiono, both of Ako, Japan

[73] Assignee: Mitsubishi Denki Kabushiki Kaisha, Japan

[21] Appl. No.: 246,747

[22] Filed: Sep. 20, 1988

[30] Foreign Application Priority Data

Sep. 22, 1987 [JP] Japan .................... 62-238107
Mar. 8, 1988 [JP] Japan .................... 63-52717

[51] Int. Cl.$^4$ ............................. G01R 31/34
[52] U.S. Cl. .................... 324/547; 324/726; 364/483
[58] Field of Search .............. 324/520, 522, 546, 547, 324/55, 253–255; 364/576, 481–484, 551.01

[56] References Cited

U.S. PATENT DOCUMENTS 3,863,109  1/1975  Emanuel et al. ............... 317/14 R
4,027,239  5/1977  Kerns .......................... 324/118
4,658,213  4/1987  Finley ......................... 324/546 X
4,723,220  2/1988  Smith-Vaniz .................. 364/576 X

FOREIGN PATENT DOCUMENTS 0278193  8/1988  European Pat. Off. .
62-28353 2/1987  Japan .

Primary Examiner—Gerard R. Strecker
Assistant Examiner—Jack B. Harvey
Attorney, Agent, or Firm—Leyding, Voit & Mayer

[57] ABSTRACT

An apparatus for detecting direct current magnetic flux deflection of an electrical transformer comprising a magnetic detector for generating an output voltage waveform and Fourier series developer connected to the magnetic detector for developing the output voltage waveform from the magnetic detector into a Fourier series. An even number harmonic detector is connected to the Fourier series developer for detecting an even number harmonic in the Fourier series, thereby determining the presence of a direct current magnetic flux deflection. A process for detecting direct current magnetic flux deflection is also disclosed.

10 Claims, 4 Drawing Sheets

APPARATUS AND PROCESS FOR DETECTING DIRECT CURRENT MAGNETIC FLUX DEFLECTIONS IN AN ELECTRICAL TRANSFORMER EMPLOYING FOURIER ANALYSIS

BACKGROUND OF THE INVENTION

This invention relates to an apparatus and a process for detecting a direct current magnetic flux deflection of an electrical transformer which requires minimum space and which generates no loss or noise.

Since the a.c. output voltage from an inverter is generally low, it is necessary to connect the output voltage to the primary coil of an electrical transformer to boost the a.c. voltage. However, with an inverter which utilizes transistors or the like, the a.c. output voltage may include a d.c. component due to the deviation of the voltage drop in the respective arms of the inverter circuit as well as the deviation of the conduction periods of the transistors in the inverter. When the d.c. component is included in the a.c. output voltage from the inverter, an electrical transformer, which is connected as a load to the output terminal of the main circuit of the inverter, generates a d.c. magnetic flux deflection, causing the characteristics of the transformer to be degraded because of the increase in iron loss, excitation current, and noise. Therefore, the d.c. magnetic flux deflection in an electrical transformer must be detected and prevented.

Japanese Patent Application No. 62-28353 discloses one example of a conventional apparatus and process for detecting d.c. magnetic flux deflection in an electrical transformer. According to this apparatus, electrical current detecting means in which a saturable reactor for detecting an electric current is connected in parallel to the main circuit of the inverter, and polarity determining means for determining by a photo-coupler the polarity of the current in the reactor detected by the current detecting means are used.

However, with the conventional apparatus as above discussed, extra space for installing an additional bulky device, which is the saturable reactor, is necessary and the saturable reactor itself generates iron loss and noise.

SUMMARY OF THE INVENTION

Accordingly, an object of the present invention is to provide an apparatus for detecting direct current magnetic flux deflection of an electrical transformer which is free from the above-discussed problems.

Another object of the present invention is to provide an apparatus for detecting direct current magnetic flux deflection of an electrical transformer in which no extra space is necessary and no iron loss or noise are generated.

Still another object of the present invention is to provide a process for detecting direct current magnetic flux deflection of an electrical transformer which is free from the above-discussed problems.

Another object of the present invention is to provide a process for detecting direct current magnetic flux deflection of an electrical transformer in which no extra space is necessary and no iron loss or noise are generated.

With the above objects in view, the apparatus for detecting direct current magnetic flux deflection of an electrical transformer according to the present invention comprises a magnetic detector, means connected to the magnetic detector for developing a waveform of an output voltage from the magnetic detector into a Fourier series, and an even number harmonic detector connected to the waveform developing means for detecting the presence of an even number harmonic.

The process for detecting direct current magnetic flux deflection of an electrical transformer according to the present invention is a process for detecting a direct current magnetic flux deflection by providing a magnetic detector in the vicinity of an iron core of the electrical transformer, developing a waveform of an output voltage from the magnetic detector into a Fourier series, and detecting the presence of an even number harmonic.

The present invention determines the presence of a direct current magnetic flux deflection by directly monitoring the change in the magnetization force of the iron core by utilizing the phenomenon that the positive and negative polarity magnetization of the iron core becomes asymmetrical and an even number harmonic is included in an output voltage from the magnetic detector when the iron core of an electric transformer generates a direct current magnetic flux deflection.

BRIEF DESCRIPTION OF THE DRAWINGS

The present invention will become more readily apparent from the following detailed description of the preferred embodiment taken in conjunction with the accompanying drawings, in which.

Throughout the drawings, the same reference numerals designate identical or corresponding components.

DESCRIPTION OF THE PREFERRED EMBODIMENTS

Figure 1:
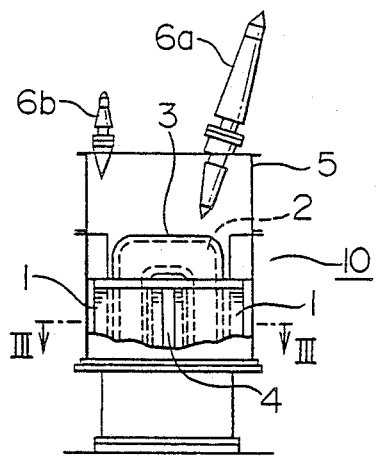
FIG. 1 is a schematic front view of a shell-type electrical transformer in which the apparatus for detecting d.c. magnetic flux deflection of the present invention is applied.
Figure 2:
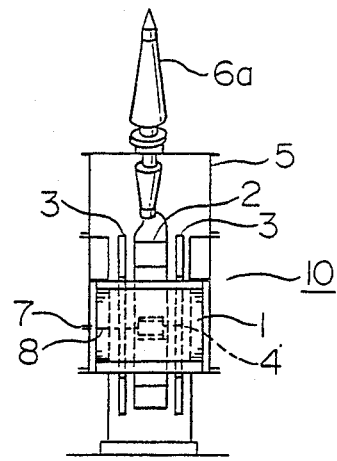
FIG. 2 is a schematic side view of the transformer shown in FIG. 1.
Figure 3:
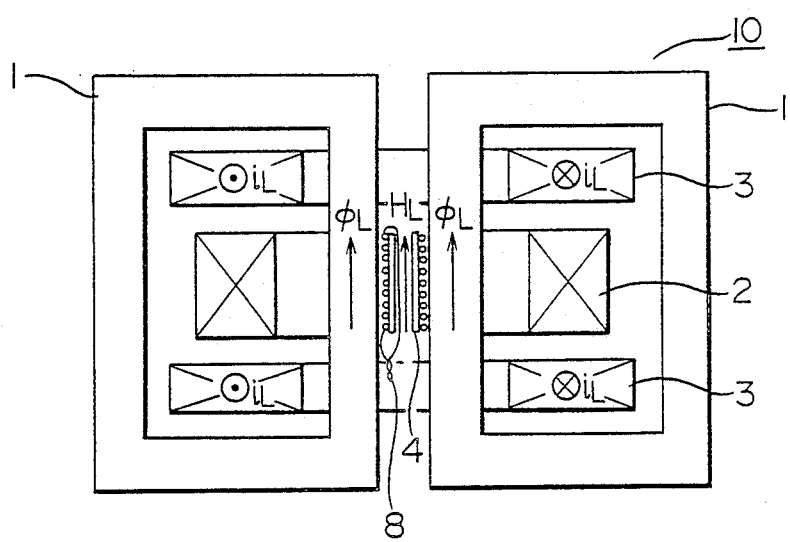
FIG. 3 is a horizontal sectional view taken along line III—III of FIG. 1.

In FIGS. 1 to 3, an electrical transformer 10 of the shell-type to which the apparatus for detecting magnetic flux deflection can be applied is illustrated. The transformer 10 comprises two substantially rectangular iron cores 1 supported by and contained within a tank 5. The iron cores 1 define magnetic circuits of the electrical transformer 10. The primary low voltage coils 3 and a secondary high voltage coil 2 are wound on the iron cores 1. The secondary coil 2 is connected to electrical bushings 6a and 6b of different sizes mounted on the tank 5 for external connection. It is seen that a magnetic detector 4 is disposed between two iron cores 1. The magnetic detector 4 is electrically connected by a lead 8 to output terminals 7 mounted on the tank 5 so that the output voltage from the magnetic detector 4 can be supplied to the external circuit which can be described later.

As shown in FIG. 3, in an unloaded excitation condition in which no load is connected to the high voltage coil 2, when an excitation current $i_L$ flows through the respective low voltage coils 3, a magnetic flux $\phi_L$ is generated in the respective iron cores 1 by this excitation current $i_L$, generating a magnetic field $H_L$ corresponding to the magnetization force of the iron cores 1.

According to the present invention, a magnetic detector 4 is disposed in the vicinity of the iron cores 1. In the embodiment shown in FIG. 3, the magnetic detector 4 is a search coil. While the magnetic detector 4 shown in FIGS. 1 to 3 is located substantially at the center of the iron cores 1, it may be positioned in any other position where the magnetic field $H_L$ can be detected.

Figure 4:
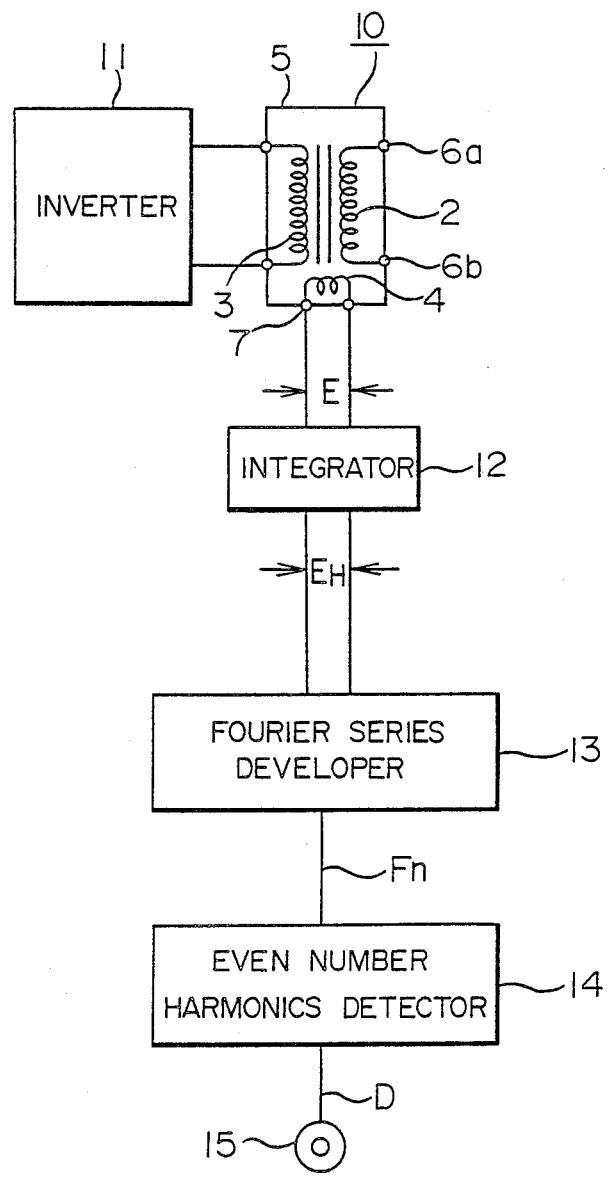
FIG. 4 is a block diagram of a direct current magnetic flux deflection detection circuit used in one embodiment of the present invention in which a search coil is used.

FIG. 4 illustrates a block diagram of the d.c. magnetic flux deflection detection apparatus of the present invention. It is seen that the apparatus is used with the electrical transformer 10 connected to an inverter 11. The inverter 11 is connected to the low-voltage primary coil 3 of the electrical transformer 10. The high-voltage secondary coil 2 can be connected to a desired load (not shown) through the bushings 6a and 6b mounted on the tank 5.

The magnetic detector 4 in the form of a search coil is disposed within the tank 5 and connected through the output terminal 7 to an integrator 12. The integrator 12 is connected at its output to a Fourier series developer 13 which in turn is connected to an even number harmonic detector 14 having an output terminal 15.

When the transformer 10 is in operation, an output voltage E is obtained at the output terminals 7 of the search coil 4. Since the output voltage E [V] from the serach coil 4 is proportional to a magnetic field H in the space in which the search coil 4 is disposed, differentiated in terms of time, it can be expressed by:

$$E = N \cdot S \cdot \mu \, dH/dt \quad (1)$$

where,
N: number of turns of the search coil
S: cross-sectional area of the search coil [m$^2$]
$\mu$: permeability of the search coil core [H/m]
H: magnetic field [A/m]

The output voltage E is supplied to the integrator 12 where it is integrated to provide an integrated output voltage $E_H$. Since this output voltage $E_H$ is an amount of the output voltage E from the search coil 4 integrated in terms of time, it can be expressed by:

$$E_H = A \int E \, dt$$

where, A is an integration constant. By substituting equation (1):

$$E_H = (A/N \cdot S \cdot \mu) H \quad (2)$$

This output voltage $E_H$ thus integrated is supplied to the Fourier series developer 13 where the input signal is developed into a Fourier series to provide a development signal $F_n$ (n is a positive integer). This development signal $F_n$ is supplied to the even number harmonic detector 14 to determine the presence of even number harmonic frequencies $F_2$, $F_4$, etc.

When a direct current magnetic flux deflection is generated, since the magnetization force of the iron cores 1 becomes asymmetrical in the positive and the negative directions, the positive and the negative peak values of the magnetic field H become asymmetrical and even number harmonic frequencies $F_2$, $F_4$ are included in the development signal $F_n$ which is the output from the Fourier series developer 13. Therefore, the even number harmonic detector 14 provides a detection signal D from the output terminal 15, thereby indicating the generation of the direct current magnetic flux deflection.

On the other hand, when no direct current magnetic flux deflection is generated, since the magnetization force of the iron core 1 is symmetrical in the positive and the negative directions, the positive peak value and the negative peak value of the magnetic field H are in symmetry and no even number harmonic frequencies $F_2$, $F_4$ are involved in the development signal $F_n$. Therefore, no detection signal D is provided from the output terminal 15, indicating the fact that no direct current magnetic flux deflection is generated.

Figure 6:
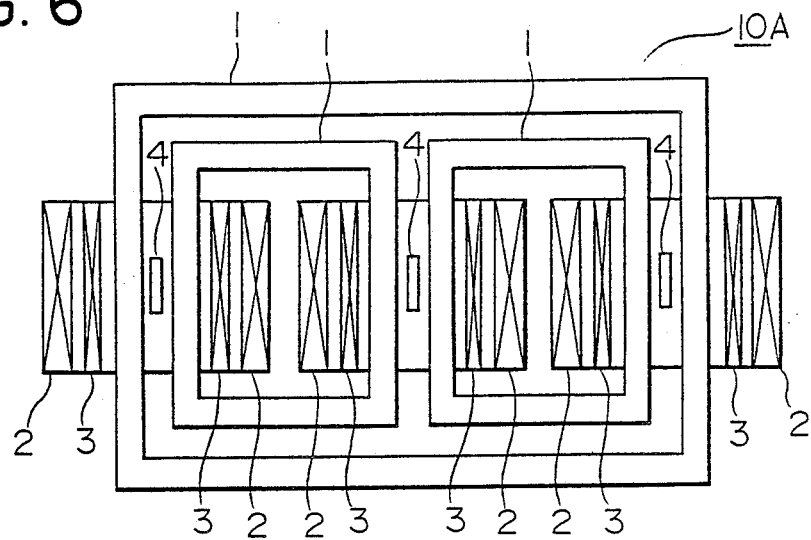
FIG. 6 is a sectional view of a core-type electrical transformer to which the present invention is applicable.

The electrical transformer to which the present invention is applicable may be either of the shell-type transformer 10 as shown in FIGS. 1 to 3, or of the core-type transformer 10A as shown in FIG. 6, providing similar advantageous results.

Figure 5:
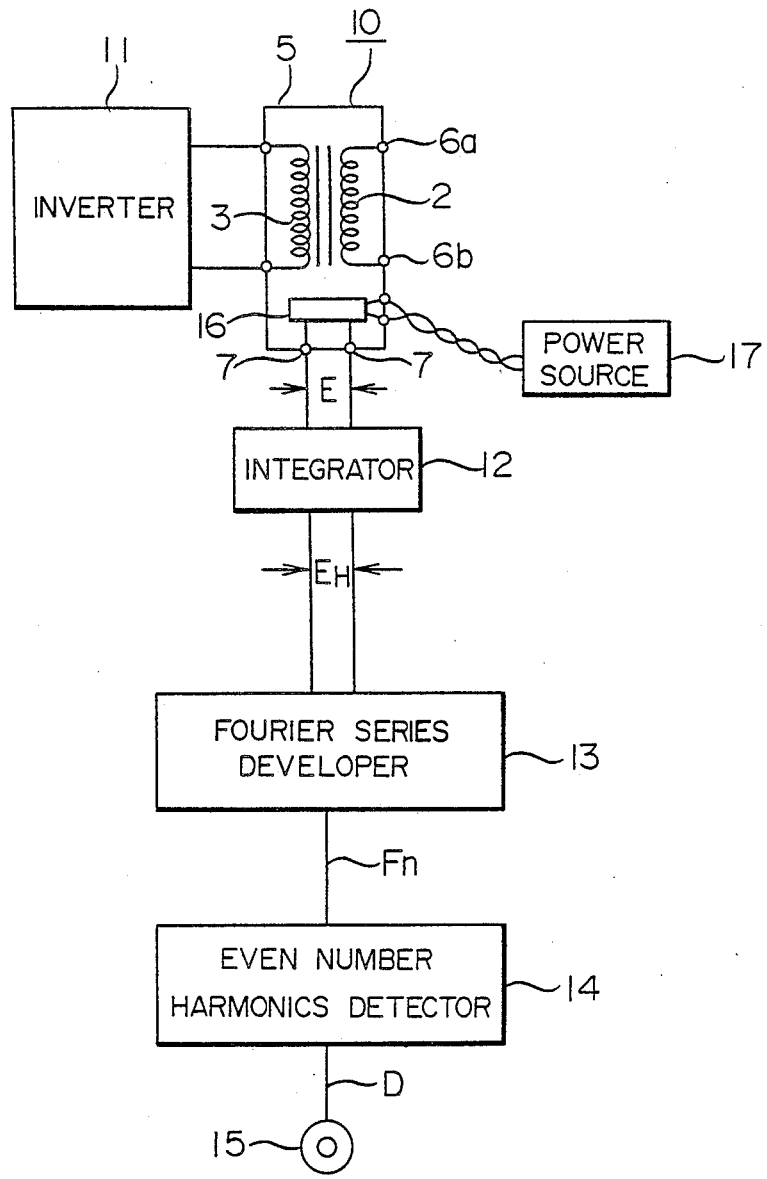
FIG. 5 is a block diagram similar to FIG. 4 but illustrating another embodiment in which a Hall element is used.

While the search coil 4 is used as the magnetic detector in the above-described embodiments shown in FIGS. 1 and 4, a Hall element 16 may equally be used as shown in FIG. 5. In this case, while an additional electric power source 17 is necessary for driving the Hall element 16, a direct current magnetic flux deflection detection circuit similar to that shown in FIG. 4 may be utilized.

Also in the above embodiments, while the output voltage E from the magnetic detector 4 is developed into a Fourier series $F_n$ after it is integrated to become the integrated output voltage $E_H$ in order to dampen the noise component, the output voltage E from the search coil 4 may directly be developed into a Fourier series $F_n$ when the effect of the noise is small. In this case, even though the noise component is not attenuated, attenuation of the even number harmonic component contained in the output voltage E can be prevented.

As has been described, according to the present invention, a direct current magnetic flux deflection is detected by utilizing the fact that the magnetization force of the iron core becomes symmetrical when a direct current magnetic flux deflection is generated by providing a magnetic detector in the vicinity of an iron core of the electrical transformer, developing a waveform of an output voltage from the magnetic detector into a Fourier series, and by determining the presence of an even number harmonic in the waveform, providing a process for detecting a d.c. magnetic flux deflection of an electric transformer in which no extra space is necessary and no iron loss or noise are generated.

What is claimed is:

1. An apparatus for detecting direct current magnetic flux deflection in an electrical transformer having a magnetic core comprising:
   a transformer;
   a magnetic detector disposed within said transformer for detecting the magnetic flux in the transformer and for generating an output voltage waveform in response to the magnetic flux;
   Fourier series developing means connected to said magnetic detector for developing the output voltage waveform from said magnetic detector into a Fourier series; and an even number harmonic detector connected to said Fourier series developing means for detecting the presence of an even number harmonic in the Fourier series, thereby indicating the presence of direct current magnetic flux deflection.

2. An apparatus for detecting direct current magnetic flux deflection of an electrical transformer as claimed in claim 1 further comprising an integrator connected between said magnetic detector and said Fourier series developing means for integrating the output voltage waveform from said magnetic detector.

3. An apparatus for detecting direct current magnetic flux deflection of an electrical transformer as claimed in claim 1 wherein said magnetic detector comprises a search coil.

4. An apparatus for detecting direct current magnetic flux deflection of an electrical transformer as claimed in claim 2 wherein said magnetic detector comprises a search coil.

5. An apparatus for detecting direct current magnetic flux deflection of an electrical transformer as claimed in claim 1 wherein said magnetic detector comprises a Hall element.

6. An apparatus for detecting direct current magnetic flux deflection of an electrical transformer as claimed in claim 2 wherein said magnetic detector comprises a Hall element.

7. A process for detecting direct current magnetic flux deflection in an electrical transformer comprising disposing a magnetic detector within an electrical transformer having a magnetic core for producing an output voltage waveform in response to magnetic flux generated in the transformer, developing the waveform of the output voltage of said magnetic flux detector into a Fourier series, and detecting direct current magnetic flux deflection in the transformer by detecting the presence in the Fourier series of an even number harmonic.

8. A process for detecting direct current magnetic flux deflection of an electrical transformer as claimed in claim 7 wherein said waveform of the output voltage from said magnetic detector is integrated before developing into a Fourier series.

9. A process for detecting direct current magnetic flux deflection of an electrical transformer as claimed in claim 7 wherein said transformer is a shell-type transformer.

10. A process for detecting direct current magnetic flux deflection of an electrical transformer as claimed in claim 7 wherein said transformer is a core-type transformer.

* * * * *